US010261195B2

United States Patent
Chappo

(10) Patent No.: US 10,261,195 B2
(45) Date of Patent: Apr. 16, 2019

(54) IMAGING DETECTOR WITH IMPROVED SPATIAL ACCURACY

(71) Applicant: KONINKLIJKE PHILIPS N.V., Eindhoven (NL)

(72) Inventor: Marc Anthony Chappo, Elyria, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 30 days.

(21) Appl. No.: 15/746,440

(22) PCT Filed: Jul. 28, 2016

(86) PCT No.: PCT/IB2016/054495
§ 371 (c)(1),
(2) Date: Jan. 22, 2018

(87) PCT Pub. No.: WO2017/025844
PCT Pub. Date: Feb. 16, 2017

(65) Prior Publication Data
US 2018/0217274 A1     Aug. 2, 2018

Related U.S. Application Data

(60) Provisional application No. 62/202,429, filed on Aug. 7, 2015.

(51) Int. Cl.
*G01T 1/17* (2006.01)
*H03M 1/14* (2006.01)
(Continued)

(52) U.S. Cl.
CPC ............... *G01T 1/17* (2013.01); *H03M 1/145* (2013.01); *H04N 5/32* (2013.01); *H03M 1/466* (2013.01); *H03M 1/60* (2013.01)

(58) Field of Classification Search
CPC ....................................................... G01T 1/17
See application file for complete search history.

(56) References Cited

U.S. PATENT DOCUMENTS 4,052,620 A * 10/1977 Brunnett ................ A61B 6/032
378/901
4,965,578 A * 10/1990 Poujois ..................... H03M 1/14
341/156

(Continued)

FOREIGN PATENT DOCUMENTS

EP        2852154        3/2015

OTHER PUBLICATIONS

Luhta, et al., "A New 2D-Tiled Detector for Multislice CT," Medical Imaging 2006: Physics of Medical Imaging, vol. 6142, pp. 275-286 (2006).

*Primary Examiner* — David P Porta
*Assistant Examiner* — Djura Malevic

(57) ABSTRACT

A detector array (112) of an imaging system (100) includes a radiation sensitive detector (202/204/206) configured to detect radiation and generates a signal indicative thereof and electronics (208) in electrical communication with the radiation sensitive detector. The electronics include a current-to-frequency converter (300) configured to convert the signal into a pulse train having a frequency indicative of a charge collected during an integration period. The electronics further include a residual charge collection circuit (322) electrically coupled to current-to-frequency converter. The residual charge collection circuit is configured to store charge collected by the integrator for an end portion of the integration period that does not results in a pulse of the pulse train, utilizing much of the electronics already in the current-to-frequency converter electronics.

20 Claims, 6 Drawing Sheets

(51) Int. Cl.
  *H04N 5/32* (2006.01)
  *H03M 1/60* (2006.01)
  *H03M 1/46* (2006.01)

(56) References Cited

U.S. PATENT DOCUMENTS

| | | | | |
|---|---|---|---|---|
| 5,949,483 | A * | 9/1999 | Fossum | G11C 19/282 |
| | | | | 348/303 |
| 6,366,231 | B1 * | 4/2002 | Rao | H03M 1/141 |
| | | | | 341/156 |
| 6,510,195 | B1 * | 1/2003 | Chappo | G01T 1/2018 |
| | | | | 250/208.1 |
| 6,586,743 | B1 * | 7/2003 | Overdick | G01T 1/17 |
| | | | | 250/206.1 |
| 6,671,345 | B2 | 12/2003 | Vrettos | |
| 8,265,223 | B2 * | 9/2012 | Proksa | A61B 6/032 |
| | | | | 378/4 |
| 8,710,448 | B2 * | 4/2014 | Luhta | H01L 27/14618 |
| | | | | 250/370.09 |
| 8,988,267 | B1 * | 3/2015 | Kimura | G01T 1/2928 |
| | | | | 341/155 |
| 2002/0141530 | A1 * | 10/2002 | Vrettos | A61B 6/032 |
| | | | | 378/19 |
| 2006/0100510 | A1 * | 5/2006 | Klausz | A61B 6/032 |
| | | | | 600/429 |
| 2006/0139198 | A1 * | 6/2006 | Rao | H03M 1/1028 |
| | | | | 341/155 |
| 2008/0279472 | A1 * | 11/2008 | Hannequin | G06T 5/10 |
| | | | | 382/260 |
| 2009/0132789 | A1 * | 5/2009 | Rao | G06G 7/18 |
| | | | | 712/36 |
| 2010/0215146 | A1 * | 8/2010 | Rao | H03M 1/129 |
| | | | | 378/62 |
| 2011/0135052 | A1 * | 6/2011 | Proksa | A61B 6/032 |
| | | | | 378/5 |
| 2011/0315888 | A1 * | 12/2011 | Herrmann | A61B 6/032 |
| | | | | 250/369 |
| 2013/0141261 | A1 * | 6/2013 | Johancsik | H03M 1/54 |
| | | | | 341/118 |
| 2014/0021356 | A1 * | 1/2014 | Zwaans | G01T 1/2985 |
| | | | | 250/362 |
| 2015/0083925 | A1 * | 3/2015 | Prendergast | G01T 1/247 |
| | | | | 250/370.09 |

* cited by examiner

IMAGING DETECTOR WITH IMPROVED SPATIAL ACCURACY

CROSS REFERENCE TO RELATED APPLICATIONS

This application is the U.S. National Phase application under 35 U.S.C. § 371 of International Application No. PCT/IB2016/054495 filed Jul. 28, 2016, published as WO 2017/025844 on Feb. 16, 2017, which claims the benefit of U.S. Provisional Patent Application No. 62/202,429 filed Aug. 7, 2015. These applications are hereby incorporated by reference herein.

FIELD OF THE INVENTION

The following generally relates to a computed tomography (CT) imaging system radiation sensitive detector with improved spatial accuracy.

BACKGROUND OF THE INVENTION

A CT scanner includes an x-ray tube mounted on a rotatable gantry that rotates around an examination region about a longitudinal or z-axis. A detector array subtends an angular arc opposite the examination region from the x-ray tube. The detector array detects radiation that traverses the examination region and a subject or object therein and generates a signal indicative thereof. The detector array generally includes a scintillator array optically coupled to a photosensor array, which is electrically coupled to processing electronics. The scintillator array generates light indicative of radiation impinging thereon, the photosensor array generates an electrical signal indicative of the light, and the processing electronics includes an analog-to-digital (A/D) converter that generates digital data indicative of the detected radiation based on the electrical signal. The digital data is processed to generate a signal, which is reconstructed to generate volumetric image data and one or more images therefrom.

A CT scanner has utilized a current to frequency (I/F) converter as the A/D converter. However, this converter is limited in spatial accuracy in low signal, low-dose imaging procedures. By way of example, FIG. 8 shows a diagram illustrating output pulses ("OP") of the I/F converter as a function of integration period ("IP"). In this diagram, $T_1$ represents the beginning of an integration period. First, second, . . . , L pulses are generated at $T_2, T_3, \ldots T_L$. $T_M$ represents the end of the integration period and the beginning of a next integration period. In this example, a next pulse is generated at $T_N$, which occurs in the next integration period. The region 802 represents charge of the first integration period that overlaps the next integration period. The data has been re-aligned to compensate for this, which improves signal to noise, but it also creates skewing of the data in time, which reduces spatial accuracy. Unfortunately, approaches to overcome the spatial skewing have required an increase in circuitry area, cost and power requirements.

SUMMARY OF THE INVENTION

Aspects of the present application address the above-referenced matters and others.

According to one aspect, a detector array of an imaging system includes a radiation sensitive detector configured to detect radiation and generates a signal indicative thereof and electronics in electrical communication with the radiation sensitive detector. The electronics include a current-to-frequency converter configured to convert the signal into a pulse train having a frequency indicative of a charge collected during an integration period. The electronics further include a residual charge collection circuit electrically coupled to current-to-frequency converter. The residual charge collection circuit is configured to store charge collected by the integrator for an end portion of the integration period that does not result in a pulse of the pulse train.

In another aspect, a method receiving a first signal indicating an integration period started and generating, with a current to frequency converter, a pulse train with a pulse frequency indicative of input charge during the integration period. The method further includes receiving a second signal indicating the integration period ended. The method further includes storing, for the integration period, a residual charge from a last pulse of the pulse train to an end of the integration period.

In another aspect, an imaging system includes a radiation source configured to emit radiation and a detector array configured to detect emitted radiation and generate a signal indicative thereof. The detector array includes a current-to-frequency converter configured to convert the signal into a pulse train having a frequency indicative of a charge collected during an integration period. The detector array further includes a residual charge collection circuit electrically coupled to current-to-frequency converter. The residual charge collection circuit is configured to store charge collected by the current-to-frequency converter for the integration period from a last pulse generated by the current-to-frequency converter to an end of the integration period.

Still further aspects of the present invention will be appreciated to those of ordinary skill in the art upon reading and understand the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF EMBODIMENTS

Figure 1:
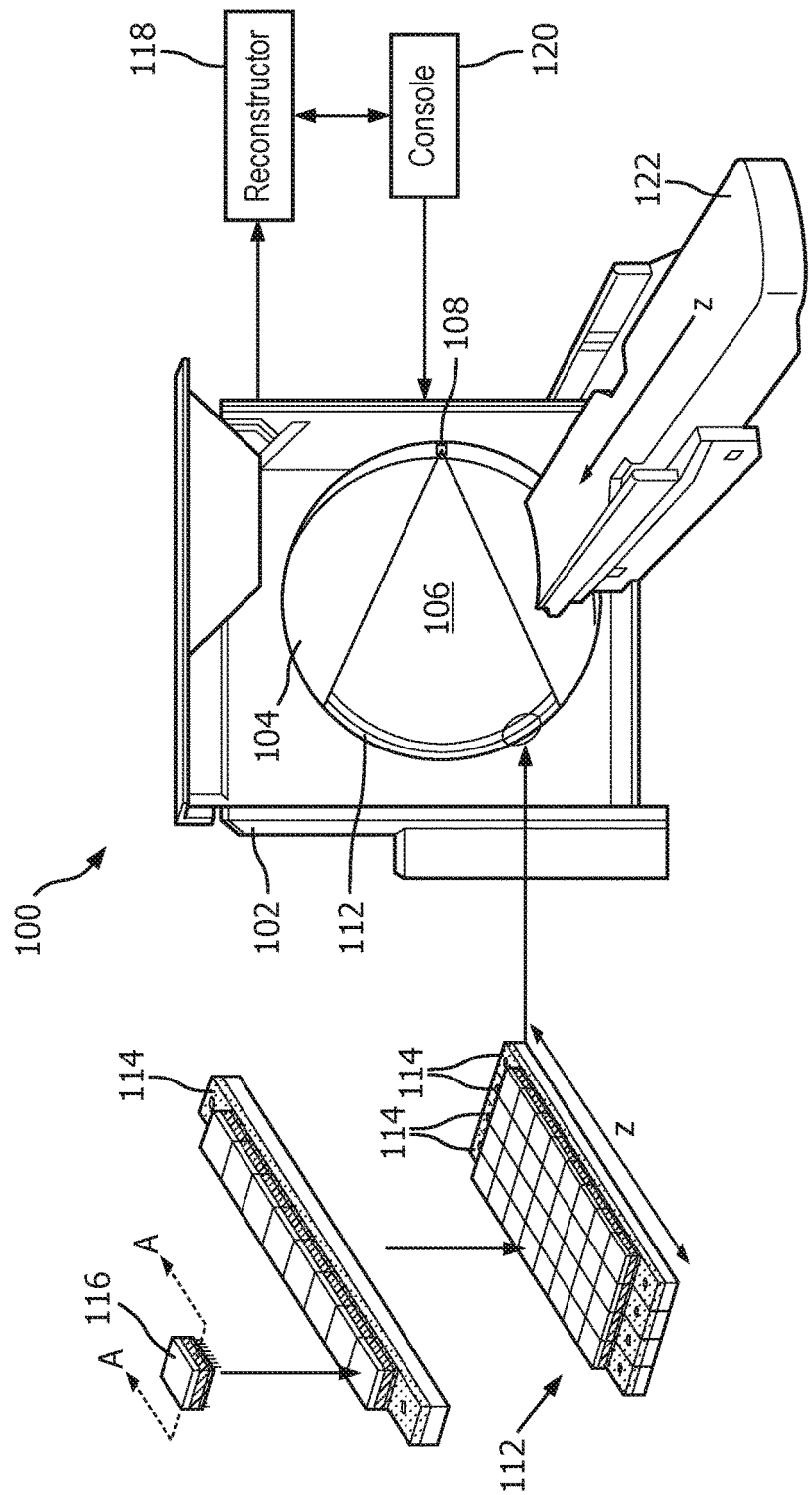
FIG. 1 schematically illustrates an example imaging system with a detector array with a plurality of detector modules, each detector module including a plurality of detector tiles.

FIG. 1 illustrates an imaging system 100 such as a computed tomography (CT) scanner. The imaging system 100 includes a generally stationary gantry 102 and a rotating gantry 104. The rotating gantry 104 is rotatably supported by the stationary gantry 102 and rotates around an examination region 106 about a longitudinal or z-axis. A radiation source 108 such as an x-ray tube is supported by the rotating gantry 104 and emits radiation that traverses the examination region 106.

A radiation sensitive detector array 112 subtends an angular arc opposite the radiation sources 108 across the examination region 106 and detects radiation traversing the examination region 106. In the illustrated embodiment, the radiation sensitive detector array 112 includes a plurality of detector modules 114, each extending along the z-axis direction. In one instance, the detector array 112 is substantially similar to and/or is based on the detector array described in U.S. Pat. No. 6,510,195B1, filed Jul. 18, 2001, and entitled "Solid State X-Radiation Detector Modules and Mosaics thereof, and an Imaging Method and Apparatus Employing the Same," which is incorporated herein by reference in its entirety. Other arrangements are also contemplated herein.

Figure 2:
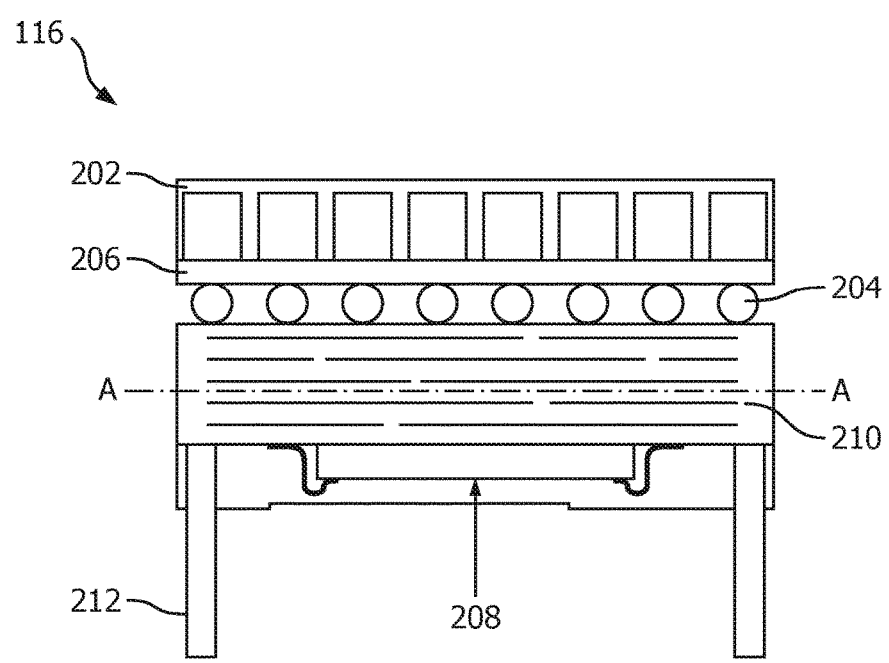
FIG. 2 schematically illustrates an example of a detector tile having an x-ray photon detection portion and processing electronics.

A detector module 114 includes a plurality of detector tiles 116 extending along the z-axis direction. Briefly turning to FIG. 2, a cross-sectional view of a detector tile 116 along line A-A of FIG. 1 is illustrated. The tile 116 includes a scintillator array 202 optically coupled to an array 204 of pixels 206, which is electrically coupled to electronics 208 through a substrate 210. Electrical conductors 212 (e.g., pins, etc.) are for power, I/O, etc. In a variation, the substrate 210 is omitted. Examples are described in "A New 2D-Tiled Detector for Multislice CT," Luhta et al., Medical Imaging 2006: Physics of Medical Imaging, Vol. 6142, pp. 275-286 (2006), and U.S. Pat. No. 8,710,448 B2, filed on Mar. 8, 2007, and entitled "Radiation Detector Array," which is incorporated in its entirety by reference herein.

Figure 8:
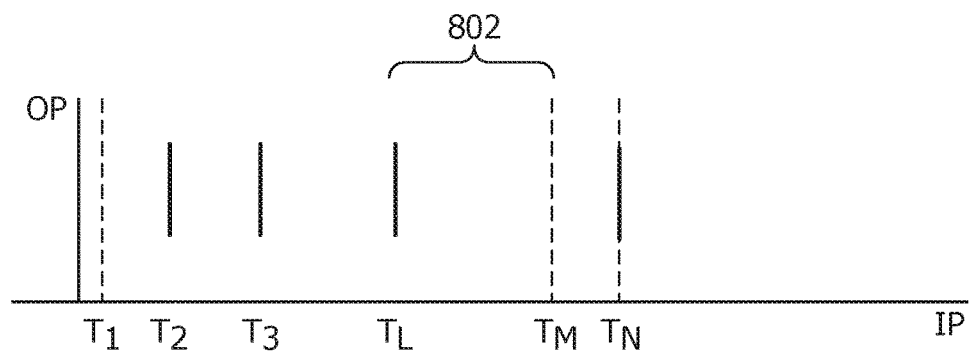
FIG. 8 illustrates an example diagram showing pulse output of a current to frequency converter as a function of integration period.

As described in further detail below, existing components of the electronics 208 are re-configured through additional switches to implement a self-contained residual charge switched-capacitor based converter that provides an accurate measurement of residual charge 802 (FIG. 8), which can be added to the charge indicated by the output of the I/F converter to determine a total charge for an integration period. This approach mitigates an increase in the area, cost and power requirements of the electronics 208, while allowing data collection to end coincident with the end of each integration period, eliminating spatial skewing associated with re-aligning pulses overlapping subsequent integration periods. This approach is well suited for x-ray tubes with fast KV (grid switching) and/or other attributes that magnify such spatial skewing.

Returning to FIG. 1, a reconstructor 118 reconstructs the signal from the detector array 112 and generates volumetric image data indicative thereof. The volumetric image data can be further processed to generate one or more images of the scanned portion of the subject or object. A computing system serves as an operator console 120. Software resident on the console 120 allows the operator to control the operation of the system 100. A patient support 122, such as a couch, supports an object or subject such as a human patient in the examination region 106.

Figure 3:
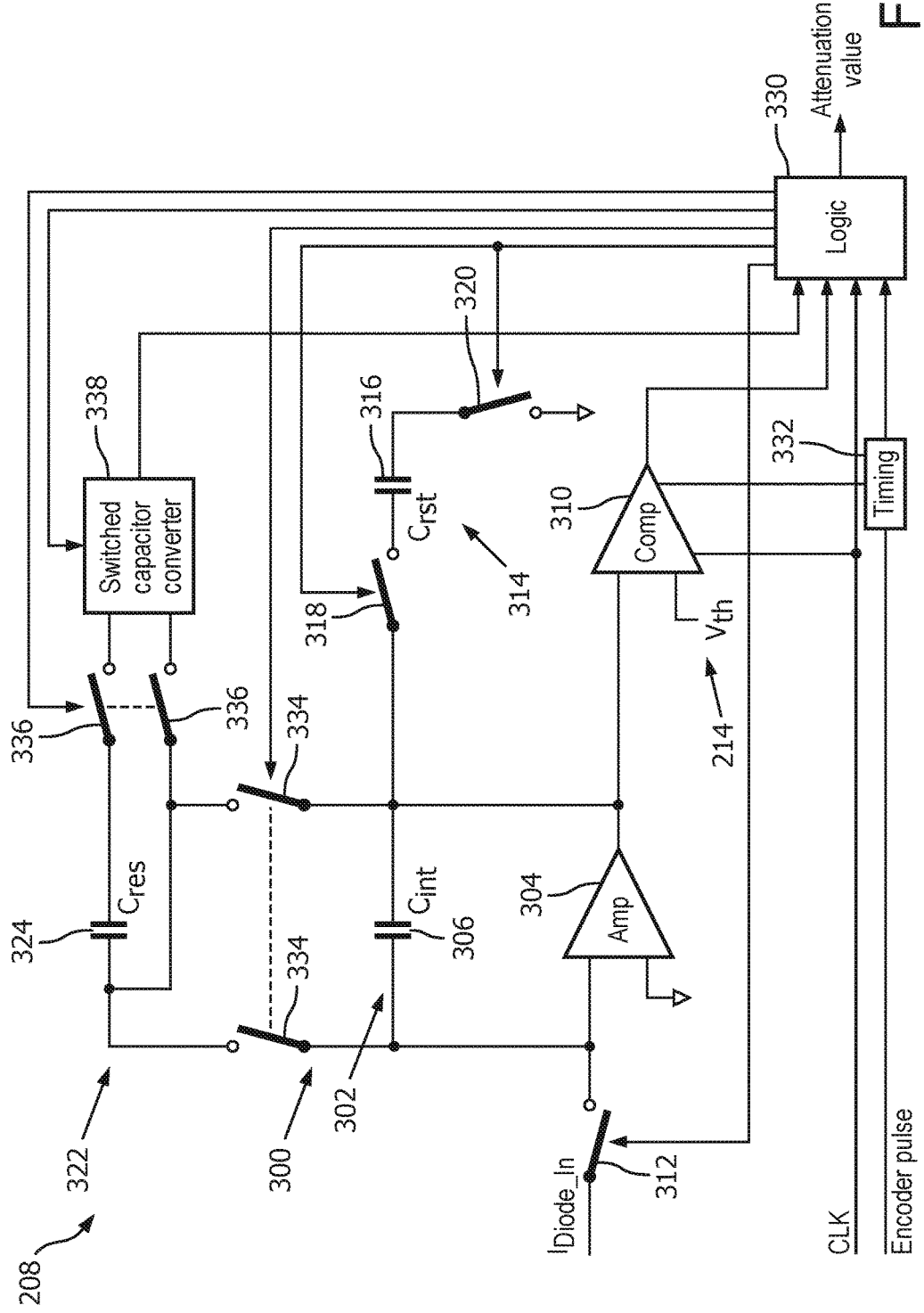
FIG. 3 schematically illustrates an example of the electronics, including an OF converter and a residual charge collection circuit.

FIG. 3 schematically illustrates an example of at least a sub-portion the electronics 208 for the pixel 206. An analog-to-digital (A/D) converter 300 includes an integrator 302 (an amplifier 304 and an integrating capacitor ($C_{int}$) 306) and a comparator 310. The integrator 302 is configured to integrate charge ($I_{Diode\_In}$) from the pixel 206 (and a bias current, if employed) during each integration period. The comparator 310 compares an output of the amplifier 304 with a predetermined threshold value ($V_{th}$) and generates a signal indicative thereof such as a pulse when the output rises above $V_{th}$.

A data collection switch 312 disconnects the A/D converter 300 to and from the pixel 206 during the reset of the integrating capacitor ($C_{int}$) 306. A reset circuit 314 (a reset capacitor ($C_{rst}$) 316 and reset switches 318 and 320) is configured to reset the integrator 302 during each integration period in response to the generation of a pulse by the comparator 310. A residual charge collection circuit 322 (a residual charge capacitor ($C_{res}$) 324 and residual charge switches 334) is configured to store charge collected by the integrating capacitor 306 from a last pulse generated in an integration period to the end of the integration period. Switches 334 are briefly closed and once a ratio of the residual charge is transferred to the residual charge capacitor ($C_{res}$) 324, the switches 334 are opened and then the integrator capacitor ($C_{int}$) 306 is reset by connecting it to the reset Capacitor ($C_{rst}$) 316 via operation of reset switches 318 and 320 and input disconnect switch 312, to begin a next integration period.

In the illustrated example, the A/D converter 300 is implemented as a current-to-frequency (I/F) converter in that it generates a pulse train with a pulse frequency indicative of the input charge ($I_{Diode\_In}$). An example of an OF converter is further described in U.S. Pat. No. 6,671,345 B2, filed Nov. 7, 2001, and entitled "Data Acquisition for Computed Tomography," which is incorporated herein by reference in its entirety. Other suitable electronics are described in U.S. Pat. No. 4,052,620, filed Nov. 28, 1975, and entitled "Data Acquisition for Computed Tomography," which is incorporated herein by reference in its entirety.

Logic 330 controls the data collection switch 312 and the reset switches 318 and 320 based on the output of the comparator 310, a clock ("CLK") and the output of a timing circuit 332, which determines timing base on an encoder pulse indicating the end/beginning of an integration period. In general, the clocking of the switched capacitor converter 338 at a higher rate than the channel samples allows for converting the residual charge balance quickly at the end of an integration period such that residual charge conversion ends within the spatial sampling period The charge value transferred to the residual capacitor ($C_{res}$) 324 is connected to a switched capacitor converter 338 via switches 336 and converted at a very high conversion clock rate. The switched capacitor converter 338 can be implemented with its own comparator and bank of capacitors (as shown) or can be clocked fast enough (e.g., 10-30 times higher) to utilize existing circuitry in the channel like the comparator 310 for its function. If so used, additional switches would configure the comparator 310 to perform conversion under the control of the logic 330, which would be completed during the same time of a reset pulse in normal operation. It can also be appreciated the residual capacitor ($C_{res}$) 324 can be eliminated and residual charge on the integrating capacitor ($C_{int}$) 306 can be measured directly using the existing comparator 310 if the amount of charge lost from the input being disconnected is small due to clocking the comparator 310 very quickly.

In this example, the logic 330 is also configured to count the number of pulses from the comparator 310 during an integration period and determines a time from a first pulse of the integration period to the last pulse of the integration period. From this data, the logic 330 generates a frequency signal by dividing the number of pulses by the time between the pulses, which is indicative of collected charge. This frequency data is combined with the residual charge value stored by the residual charge collection circuit 322. The logic 330 also issues a reset signal coincident with the end of the integration period to ensure the charge on the integration capacitor $C_{int}$ 306 is reset to the same value as if a complete pulse had been measured. Since the voltage on the reset capacitor $C_{rst}$ 316 is selectable from an existing settable voltage reference, the threshold voltage of the switched capacitor converter 338 is likewise settable without additional circuitry. The logic 330 processes the result to determine an attenuation value, which is output in a signal, e.g., in a 16-bit word.

Figure 4:
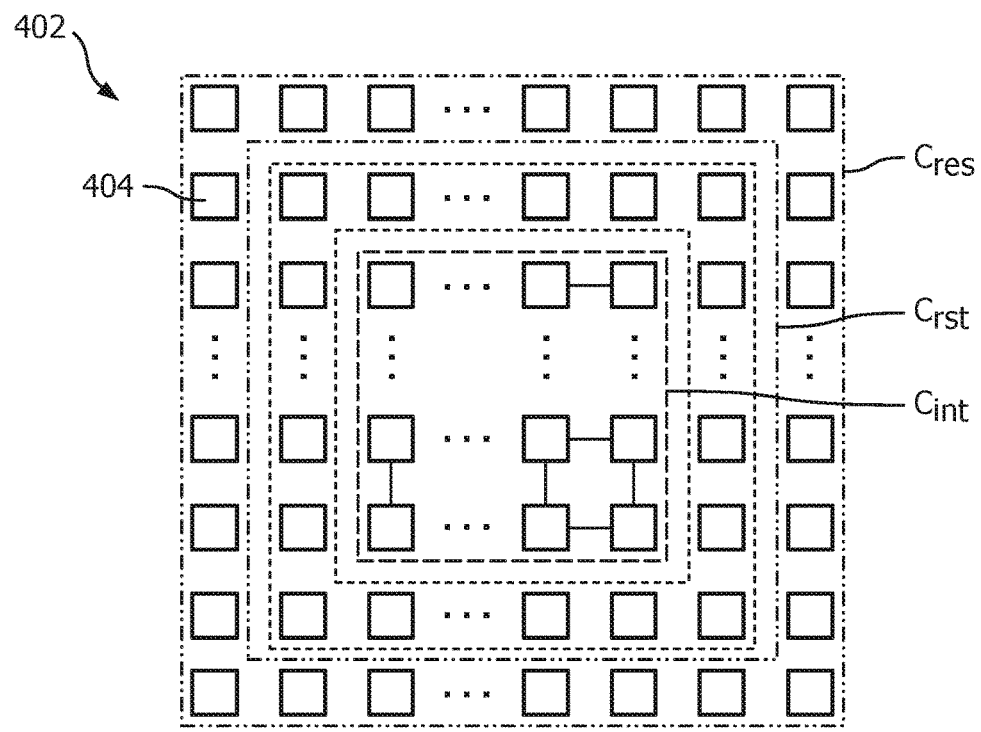
FIG. 4 schematically illustrates an example bank of capacitors configured to provide an integrating capacitor, a reset capacitor and a residual charge capacitor.
Figure 5:
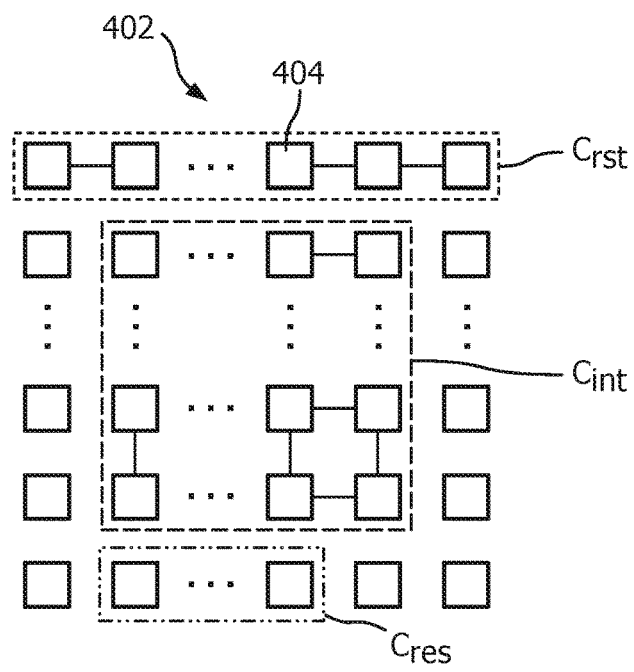
FIG. 5 schematically illustrates another example of the bank of capacitors configured to provide the integrating capacitor, the reset capacitor and the residual charge capacitor.

FIGS. 4 and 5 schematically illustrate a bank 402 of capacitors 404 configured to provide $C_{int}$ 306 and $C_{rst}$ 316 and $C_{res}$ 324. In FIG. 4, different sub-sets of different capacitors 404 are electrically connected in parallel to respectively provide $C_{int}$ 306, $C_{rst}$ 316 and $C_{res}$ 324. In FIG. 4, all of the capacitors 404 of the bank 402 are used. FIG. 5 shows a variation in which not all of the capacitors 404 of the bank 402 are needed to provide $C_{int}$ 306 and $C_{rst}$ 316 and $C_{res}$ 324. Other combinations of capacitors 404 for providing $C_{int}$ 306 and $C_{rst}$ 316 and $C_{res}$ 324 are also contemplated herein.

Figure 6:
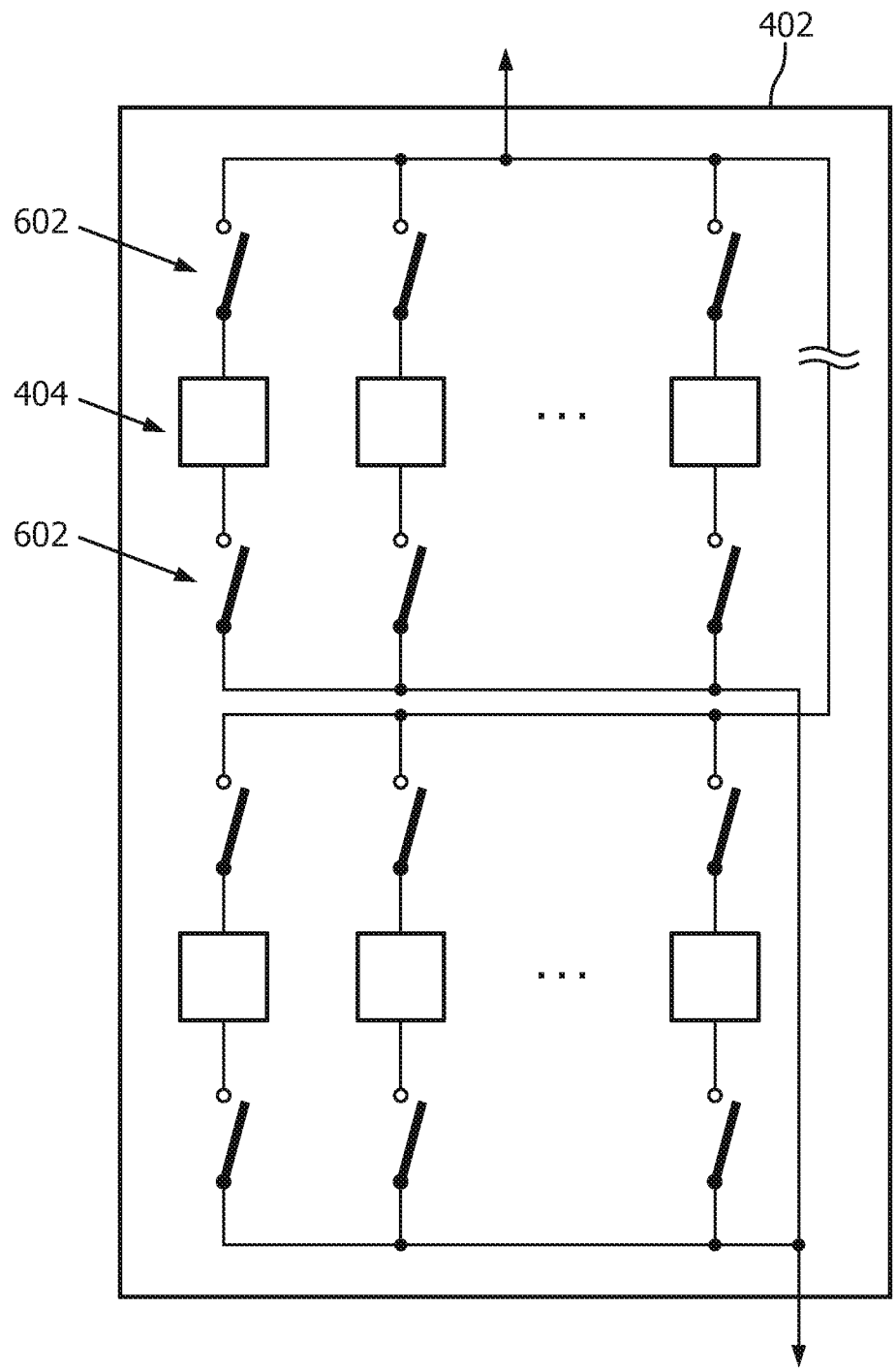
FIG. 6 schematically illustrates an example approach for connecting capacitors of the banks of FIGS. 4 and 5 to provide the integrating capacitor, the reset capacitor and the residual charge capacitor.

FIG. 6 schematically shows how capacitors 404 can be connected together. In FIG. 6, each of the capacitors 404 of the bank is associated with at least one switch 602. The switches 602 in the illustrated example are used to connect capacitors 404 of the bank 402 electrically in parallel to create $C_{int}$ 306 and $C_{rst}$ 316 and $C_{res}$ 324 with particular capacitance values for $C_{int}$ 306 and $C_{rst}$ 316 and $C_{res}$ 324. The switches 602 can be configured to select any connection to any bank of capacitance $C_{int}$ 306, $C_{rst}$ 316 and $C_{res}$ 324.

Where the bank 402 for $C_{int}$ 306 and $C_{rst}$ 316 already includes enough unused capacitors 404 for also implementing $C_{res}$ 324, only the switches 334, the timing circuit 332, control by the logic 330, and processing of the residual charge by the logic 330 are added to implement $C_{res}$ 324. In another instance, where the bank 402 includes enough capacitors 404 for $C_{int}$ 306 and $C_{rst}$ 316 but not for $C_{res}$ 324, one or more capacitors are added to the bank 402 to implement also implement $C_{res}$ 324.

The electronics 208 described herein can be implemented via CMOS and/or other fabrication process by adding the switches 334, re-configuring the capacitor bank 402, and adding the timing circuit 332.

Figure 7:
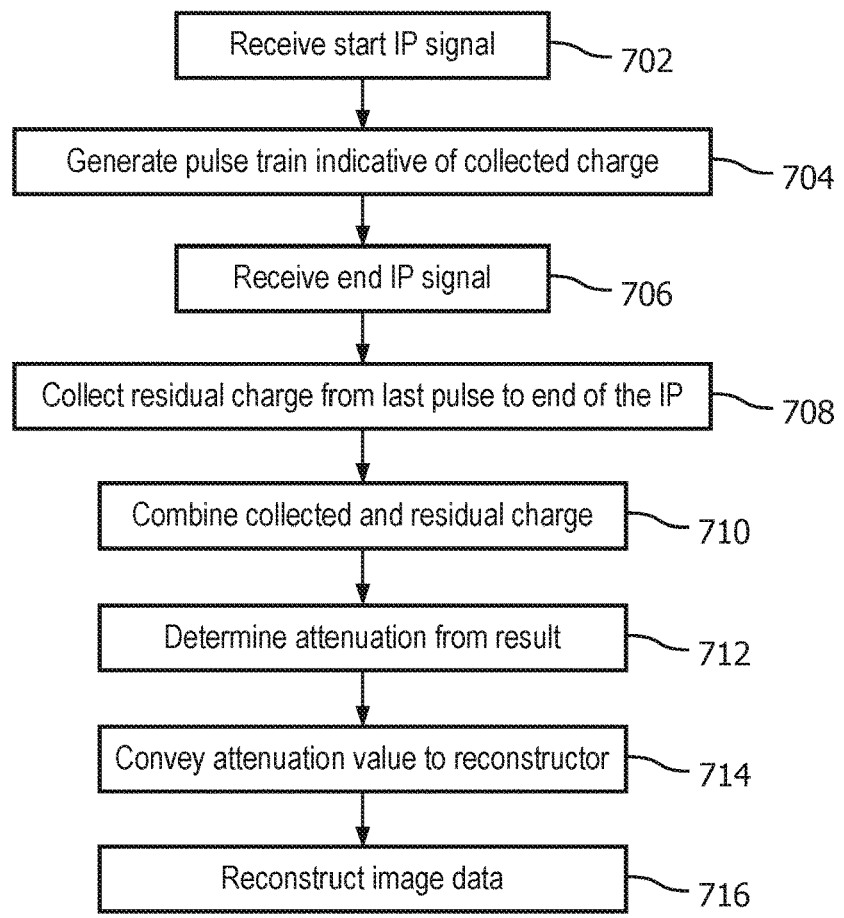
FIG. 7 illustrates an example method in accordance with an embodiment described herein.

FIG. 7 illustrates an example method in accordance with an embodiment described herein.

At 702, a first signal indicating start of a first integration period is received.

At 704, a pulse train with a pulse frequency indicative of the input charge is generated by the current to frequency converter 300 for the integration period.

At 706, a second signal indicating end of the integration period is received.

At 708, a residual charge collected by the current to frequency converter 300 for the end of the integration period is stored.

At 710, the pulse train and the residual charge are used to determine a total charge for the integration period.

At 712, the total charge is processed to determine an attenuation value.

At 714, the attenuation value is conveyed to the reconstructor 118.

At 716, attenuation values for multiple integration periods are reconstructed to generate volumetric image data.

The invention has been described herein with reference to the various embodiments. Modifications and alterations may occur to others upon reading the description herein. It is intended that the invention be construed as including all such modifications and alterations insofar as they come within the scope of the appended claims or the equivalents thereof.

What is claimed is:

1. A detector array of an imaging system, comprising:
a radiation sensitive detector configured to detect radiation and generates a signal indicative thereof; and
electronics in electrical communication with the radiation sensitive detector, wherein the electronics includes:
a current-to-frequency converter configured to convert the signal into a pulse train having a frequency indicative of a charge collected during an integration period;
a residual charge collection circuit electrically coupled to current-to-frequency converter, wherein the residual charge collection circuit is configured to store charge collected by the integrator for an end portion of the integration period that does not results in a pulse of the pulse train; and
a single bank of capacitors, wherein a first subset of the capacitors includes integrating capacitor of the current-to-frequency converter, a second different subset of the capacitors includes a reset capacitor, and a third different subset of the capacitors includes a residual charge capacitor of the residual charge collection circuit.

2. The detector array of claim 1, further comprising:
logic configured to combine the charge indicated by the pulse train and the residual charged stored by the residual charge collection circuit to generate a total charge for the integration period and generate an output signal indicative thereof.

3. The detector array of claim 2, wherein the current-to-frequency converter includes:
an integrator comprising an amplifier and the integrating capacitor, wherein the integrator is configured to integrate input charge from a pixel of the radiation sensitive detector during the integration period; and a comparator configured to compare an output of the amplifier with a predetermined threshold value and generate a pulse in response to the output satisfying the predetermined threshold value, wherein the output of the comparator generates the pulse train.

4. The detector array of claim 3, further comprising:
a reset circuit configured to reset the integrator during each integration period in response to the generation of a pulse of the pulse train by the comparator.

5. The detector array of claim 4, wherein the reset circuit includes:
the reset capacitor; and
at least two switches,
wherein the reset capacitor electrically connects to the integrating capacitor through a first switch and to electrical ground through a second switch during a reset.

6. The detector array of claim 3, wherein the residual charge collection circuit includes:
the residual charge capacitor,
wherein the residual charge capacitor is electrically connected in parallel across the integrating capacitor through switches.

7. The detector array of claim 6, further comprising: logic configured to close the at least two switches in response to an end of integration signal pulse to store the residual charge collected by the integrating capacitor.

8. The detector array of claim 7, wherein the logic is further configured to activate the reset circuit to reset the integrator in response receiving a pulse generated by the comparator during the integration period.

9. The detector array of claim 7, wherein the logic is further configured to close a data collection switch to electrically connect the radiation sensitive detector and the electronics for the integration period and open the data collection switch to electrically disconnect the radiation sensitive detector and the electronics at the end of the integration period.

10. The detector array of claim 1, wherein the single bank of capacitors includes, for each of the first subset, the second subset and the third subset, a plurality of capacitors electrically connected together series through respective switches.

11. The detector array of claim 1, wherein the integrating capacitor, the reset capacitor, and the residual charge capacitor comprise all of the capacitors of the single bank.

12. The detector array of claim 1, wherein the integrating capacitor, the reset capacitor, and the residual charge capacitor comprise only a sub-set of the capacitors of the single bank.

13. The detector array of claim 1, wherein the single bank comprises:
at least one switch for each capacitor, wherein the first subset of the capacitors is electrically connected in parallel through a corresponding first set of switches, wherein the second subset of the capacitors is electrically connected in parallel through a corresponding second set of switches, and wherein the third subset of the capacitors is electrically connected in parallel through a corresponding third set of switches.

14. The detector array of claim 1, wherein the single bank of capacitors is disposed in a first region of the electronics and occupies a same area with and without the residual charge capacitor.

15. A method, comprising:
receiving a first signal indicating a start of an integration period;
generating, with a current to frequency converter, a first pulse train with a pulse frequency indicative of input charge during the integration period;
receiving a second signal indicating an end of the integration period; and
storing, for the integration period, a residual charge from a last pulse of the pulse train to an end of the integration period in capacitors of a capacitor bank.

16. The method of claim 15, further comprising:
combining a charge indicated by the pulse train and the residual charge to generate a total charge for the integration period.

17. The method of claim 16, further comprising:
processing the total charge to generate volumetric image data.

18. The method of claim 15, wherein the capacitors include less than all of the capacitors in the capacitor bank.

19. The method of claim 15, further comprising:
receiving an encoder signal indicating the integration period ended;
generating a timing signal in response to receiving the encoder signal; and
storing the residual charge in response to the timing signal.

20. A detector array of an imaging system, comprising:
a radiation sensitive detector configured to detect radiation and generates a signal indicative thereof; and
electronics in electrical communication with the radiation sensitive detector, wherein the electronics includes:
a current-to-frequency converter configured to convert the signal into a pulse train having a frequency indicative of a charge collected during an integration period, wherein the current-to-frequency converter comprises: an integrator and a comparator, and the integrator comprises an amplifier and an integrating capacitor;
a residual charge collection circuit electrically coupled to the current-to-frequency converter, wherein the residual charge collection circuit is configured to store charge collected by the integrator for an end portion of the integration period that does not results in a pulse of the pulse train, and the residual charge collection circuit comprises: a residual charge capacitor electrically connected in parallel across the integrating capacitor and a switched capacitor converter electrically connected to the residual charge capacitor and configured to convert a charge transferred to the residual charge capacitor; and
logic configured to combine the charge indicated by the charge collected pulse train and the converted residual charged to generate a total charge for the integration period and generate an output signal indicative thereof.

* * * * *